(12) United States Patent
Li et al.

(10) Patent No.: US 12,310,110 B2
(45) Date of Patent: May 20, 2025

(54) PIXEL ARRAY SUBSTRATE

(71) Applicant: AUO Corporation, Hsinchu (TW)

(72) Inventors: Wen-Jen Li, Hsinchu (TW);
Han-Chung Lai, Hsinchu (TW);
Cheng-Han Chung, Hsinchu (TW);
Chun-Cheng Hung, Hsinchu (TW);
Han-Hung Kuo, Hsinchu (TW)

(73) Assignee: AUO Corporation, Hsinchu (TW)

( * ) Notice: Subject to any disclaimer, the term of this patent is extended or adjusted under 35 U.S.C. 154(b) by 501 days.

(21) Appl. No.: 17/899,606

(22) Filed: Aug. 30, 2022

(65) Prior Publication Data

US 2023/0402465 A1 Dec. 14, 2023

(30) Foreign Application Priority Data

May 27, 2022 (TW) .................................. 111119813

(51) Int. Cl.
*G09G 3/32* (2016.01)
*G09G 3/3266* (2016.01)
*H01L 25/075* (2006.01)
*H10D 86/40* (2025.01)
*H10D 86/60* (2025.01)

(52) U.S. Cl.
CPC ........... *H10D 86/60* (2025.01); *G09G 3/3266* (2013.01); *H01L 25/0753* (2013.01); *H10D 86/441* (2025.01); *H10D 86/451* (2025.01)

(58) Field of Classification Search
CPC ...... G09G 3/32; G09G 3/3255; G09G 3/3266; H01D 86/441; H01D 86/60
See application file for complete search history.

(56) References Cited

U.S. PATENT DOCUMENTS

| 7,564,185 | B2 | 7/2009 | Song et al. |
| 2006/0103416 | A1* | 5/2006 | Miyatake ........... G01N 23/2251 324/760.01 |
| 2007/0194710 | A1 | 8/2007 | Song et al. |
| 2010/0149473 | A1* | 6/2010 | Guo ..................... G02F 1/1345 349/122 |

(Continued)

FOREIGN PATENT DOCUMENTS

| CN | 109346499 | 2/2019 |
| CN | 113257977 | 8/2021 |

(Continued)

*Primary Examiner* — Joe H Cheng
(74) *Attorney, Agent, or Firm* — JCIPRNET (57) ABSTRACT

A pixel array substrate includes a pixel driving circuit, a first insulating layer, a pad group, and an adjustment structure. The first insulating layer is disposed on the pixel driving circuit. The pad group is electrically connected to the pixel driving circuit. The adjustment structure is disposed on the first insulating layer and is electrically connected to the pad group. The adjustment structure is located between the pad group and the pixel driving circuit. The adjustment structure includes a first adjustment part and a second adjustment part. At least a part of the first adjustment part overlaps the pad group. The second adjustment part is disposed outside the first adjustment part and is staggered from the pad group. An absorptance of the first adjustment part to a laser is higher than an absorptance of the second adjustment part to the laser.

12 Claims, 7 Drawing Sheets

(56) References Cited

U.S. PATENT DOCUMENTS

2020/0185483 A1\* 6/2020 Peng .................. H10K 71/70
2023/0317497 A1\* 10/2023 Chen .................. H10H 20/857
257/89

FOREIGN PATENT DOCUMENTS

JP 2011108992 6/2011
TW 333286 11/2010

\* cited by examiner

PIXEL ARRAY SUBSTRATE

CROSS-REFERENCE TO RELATED APPLICATION

This application claims the priority benefit of Taiwan application serial no. 111119813, filed on May 27, 2022. The entirety of the above-mentioned patent application is hereby incorporated by reference herein and made a part of this specification.

BACKGROUND

Technical Field

The disclosure relates to a pixel array substrate.

Description of Related Art

With the evolution of display technology, thinned display devices with high resolution are favored by the mainstream market. Thanks to a breakthrough in the manufacturing technology of light-emitting diodes (LED) elements in recent years, micro-LED display devices or millimeter-scale LED display devices that can be manufactured by arranging LED elements in an array have been developed. Since such display devices do not require a liquid crystal layer and a color filter, the thickness of the display device can be further reduced. In addition, compared with an organic LED display device, the micro-LED display device has the advantages of more power saving and longer service life.

In the current manufacturing process of micro-LED display devices, a large number of LED elements need to be transferred onto a pixel array substrate through mass transfer. However, the present-day display devices usually have millions of pixels, and the LED elements are so small that it is difficult to accurately align them with the pads of the pixel array substrate. The LED elements may not be accurately placed at the predetermined positions due to an alignment error, which causes the problem that the LED elements cannot be normally driven. In particular, when the LED elements and the pads of the pixel array substrate are bonded by a laser welding process, the thermal energy generated by laser irradiation may cause thermal expansion of the pixel array substrate, which makes the bonding between the LED elements and the pixel array substrate even more difficult.

SUMMARY

The disclosure provides a pixel array substrate which improves the bonding yield with LED elements.

The pixel array substrate according to an embodiment of the disclosure includes a substrate, a pixel driving circuit, a first insulating layer, a pad group, and an adjustment structure. The pixel driving circuit is disposed on the substrate. The first insulating layer is disposed on the pixel driving circuit. The pad group is electrically connected to the pixel driving circuit. The adjustment structure is disposed on the first insulating layer and is electrically connected to the pad group. The adjustment structure is located between the pad group and the pixel driving circuit. The adjustment structure includes a first adjustment part and a second adjustment part. At least a part of the first adjustment part overlaps the pad group. The second adjustment part is disposed outside the first adjustment part and is staggered from the pad group. An absorptance of the first adjustment part to a laser is higher than an absorptance of the second adjustment part to the laser.

In an embodiment of the disclosure, the first adjustment part includes a first absorption area. The first absorption area overlaps the pad group. An area of the first absorption area is larger than an area of the pad group. A vertical projection of the pad group on the substrate is located within a vertical projection of the first absorption area on the substrate.

In an embodiment of the disclosure, the first adjustment part further includes a second absorption area. The second absorption area is located around the first absorption area and has a distance from the first absorption area. The first absorption area is connected with the second absorption area.

In an embodiment of the disclosure, the pixel array substrate further includes a second insulating layer. The adjustment structure is located between the second insulating layer and the first insulating layer. The first adjustment part includes a first metal layer in contact with the second insulating layer. The first adjustment part and the second adjustment part respectively include a first part and a second part of a second metal layer. The first metal layer of the first adjustment part is located between the second insulating layer and the first part of the second metal layer. The second part of the second metal layer of the second adjustment part is in contact with the second insulating layer. An absorptance of the first metal layer to the laser is higher than an absorptance of the second metal layer to the laser.

In an embodiment of the disclosure, the first adjustment part and the second adjustment part further respectively include a first part and a second part of a third metal layer. The first part of the third metal layer of the first adjustment part, the first part of the second metal layer of the first adjustment part, and the first metal layer of the first adjustment part are stacked sequentially in a direction away from the substrate. The second part of the third metal layer of the second adjustment part and the second part of the second metal layer of the second adjustment part are stacked sequentially in the direction away from the substrate.

In an embodiment of the disclosure, the pixel array substrate further includes a second insulating layer. The adjustment structure is located between the second insulating layer and the first insulating layer. The first adjustment part includes a first metal layer in contact with the second insulating layer. The second adjustment part includes a metal oxide layer in contact with the second insulating layer. An absorptance of the first metal layer to the laser is higher than an absorptance of the metal oxide layer to the laser.

In an embodiment of the disclosure, the first adjustment part and the second adjustment part further respectively include a first part and a second part of a second metal layer. The first metal layer of the first adjustment part is located between the second insulating layer and the first part of the second metal layer of the first adjustment part. The metal oxide layer of the second adjustment part is located between the second insulating layer and the second part of the second metal layer of the second adjustment part.

In an embodiment of the disclosure, the first adjustment part and the second adjustment part further respectively include a first part and a second part of a third metal layer. The first part of the third metal layer of the first adjustment part, the first part of the second metal layer of the first adjustment part, and the first metal layer of the first adjustment part are stacked sequentially in a direction away from the substrate. The second part of the third metal layer of the second adjustment part, the second part of the second metal layer of the second adjustment part, and the metal oxide layer of the second adjustment part are stacked sequentially in the direction away from the substrate.

In an embodiment of the disclosure, a wavelength range of the laser includes 915 nm to 1064 nm. A material of the first metal layer is selected from titanium, tin or nickel. A material of the second metal layer is selected from aluminum, silver or copper.

In an embodiment of the disclosure, a wavelength range of the laser includes 400 nm to 550 nm. A material of the first metal layer is selected from titanium, copper, tin or nickel. A material of the second metal layer is selected from silver.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Reference will now be made in detail to the exemplary embodiments of the disclosure, and examples of the exemplary embodiments are illustrated in the accompanying drawings. Whenever possible, the same reference numerals are used in the drawings and description to indicate the same or similar parts.

It should be understood that when an element such as a layer, film, region, or substrate is referred to as being "on" or "connected to" another element, the layer, film, region, or substrate may be directly on or connected to the another element or there may be an intermediate element. In contrast, when an element is referred to as being "directly on" or "directly connected to" another element, there is no intermediate element. As used herein, "connection" may refer to physical and/or electrical connection. Furthermore, for "electrical connection" or "coupling," there may be another element between two elements.

As used herein, "about," "approximately" or "substantially" includes a stated value and an average value within an acceptable range of deviation from a specific value determined by persons skilled in the art, while considering specific amounts of the measurement in question and measurement-related errors (that is, the limitation of the measurement system). For example, "about" may mean within one or more standard deviations or within ±30%, ±20%, ±10% or ±5% of the stated value. Furthermore, a more acceptable range of deviation or standard deviation may be selected for "about," "approximately" or "substantially" used herein according to optical properties, etching properties or other properties, instead of using one standard deviation for all properties.

Unless otherwise defined, all terms (including technical and scientific terms) used herein have the same meaning as commonly understood by persons skilled in the art to which the disclosure belongs. It will be further understood that terms such as those defined in commonly used dictionaries should be interpreted as having meanings consistent with their meanings in the context of related technologies and the disclosure, and will not be interpreted as having idealized or overly formal meanings, unless explicitly defined herein.

Figure 1:
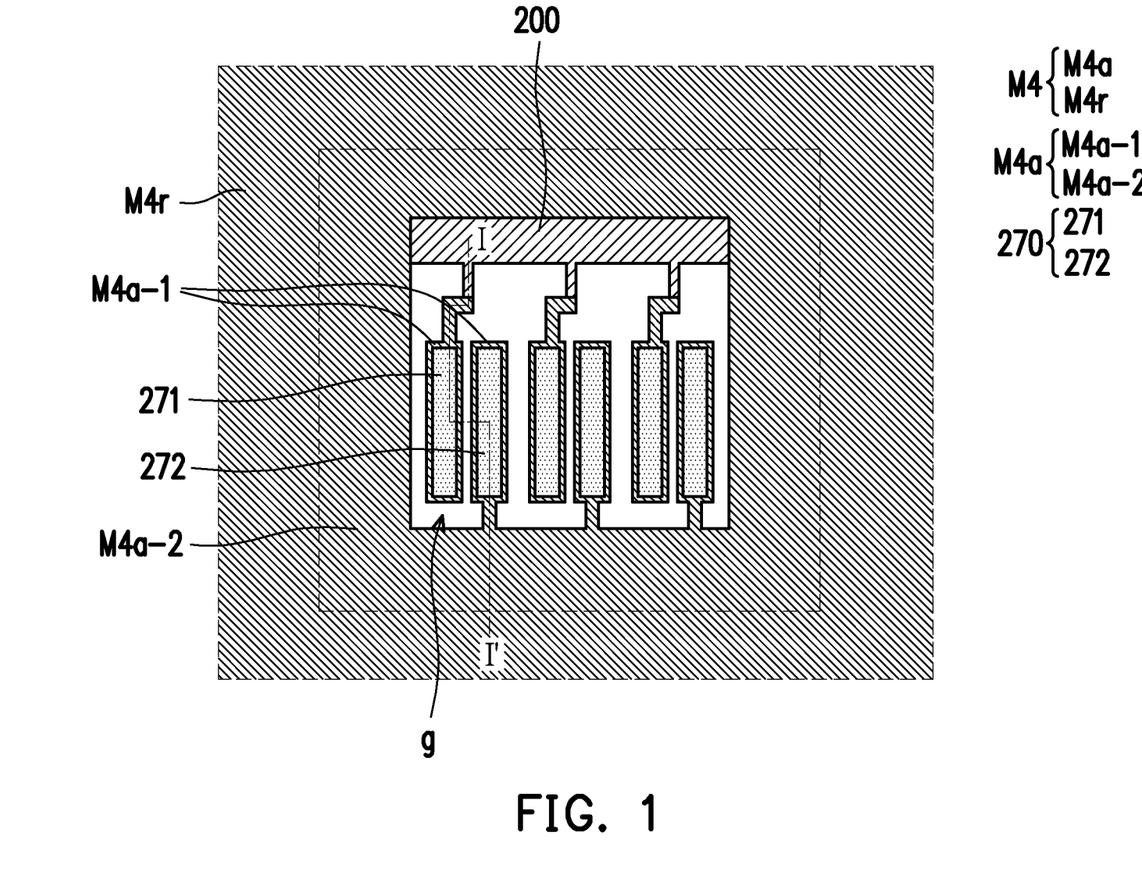
FIG. 1 is a schematic top view of the pixel array substrate 10 according to an embodiment of the disclosure.
Figure 2:
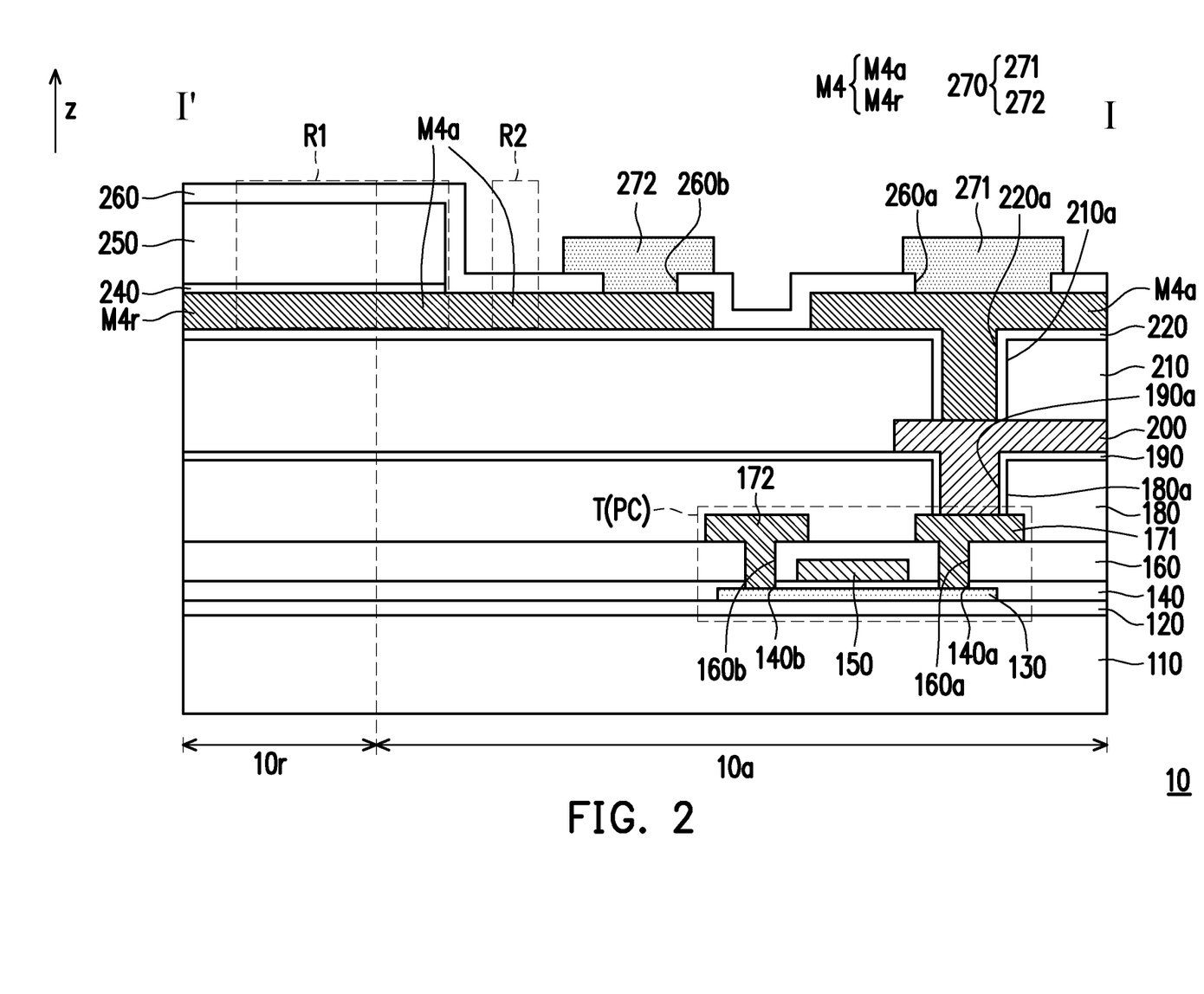
FIG. 2 is a schematic cross-sectional view of the pixel array substrate 10 according to an embodiment of the disclosure.

FIG. 1 is a schematic top view of a pixel array substrate 10 according to an embodiment of the disclosure. FIG. 2 is a schematic cross-sectional view of the pixel array substrate 10 according to an embodiment of the disclosure. FIG. 2 corresponds to the section line I-I' in FIG. 1. FIG. 1 illustrates a pad group 270, a conductive pattern 200, and an adjustment structure M4, and other components of the pixel array substrate 10 are omitted.

Referring to FIG. 1 and FIG. 2, the pixel array substrate 10 includes a substrate 110. For example, in this embodiment, the material of the substrate 110 may be glass, quartz, an organic polymer, an opaque/reflective material (for example, wafer, ceramics, etc.), or other applicable materials.

The pixel array substrate 10 further includes a pixel driving circuit PC disposed on the substrate 110. For example, in this embodiment, the pixel driving circuit PC may include a thin film transistor T. The thin film transistor T includes a semiconductor pattern 130, a gate insulating layer 140, a control terminal 150, a first terminal 171, and a second terminal 172. The gate insulating layer 140 is disposed between the control terminal 150 and the semiconductor pattern 130, and the first terminal 171 and the second terminal 172 are electrically connected to two different regions of the semiconductor pattern 130, respectively.

In this embodiment, the pixel array substrate 10 may selectively include a buffer layer 120 disposed on the substrate 110. In this embodiment, the semiconductor pattern 130 of the thin film transistor T is disposed on the buffer layer 120. The gate insulating layer 140 is disposed on the semiconductor pattern 130 of the thin film transistor T and the buffer layer 120. The control terminal 150 of the thin film transistor T is disposed on the gate insulating layer 140. The pixel array substrate 10 further includes an interlayer dielectric layer 160 disposed on the control terminal 150 and the gate insulating layer 140. The first terminal 171 of the thin film transistor T is disposed on the interlayer dielectric layer 160 and is electrically connected to the semiconductor pattern 130 through a contact window 160a of the interlayer dielectric layer 160 and a contact window 140a of the gate insulating layer 140. The second terminal 172 of the thin film transistor T is disposed on the interlayer dielectric layer 160 and is electrically connected to the semiconductor pattern 130 through another contact window 160b of the interlayer dielectric layer 160 and another contact window 140b of the gate insulating layer 140. However, the disclosure is not limited thereto, and in other embodiments, the thin film transistor T may also have other structures.

In this embodiment, the pixel array substrate 10 may further include a flat layer 180 disposed on the first terminal 171 and the second terminal 172 of the thin film transistor T. The pixel array substrate 10 further includes a first protective layer 190 disposed on the flat layer 180. The flat layer 180 may have a contact window 180a overlapping the first terminal 171 of the thin film transistor T. The first protective layer 190 may have a contact window 190a overlapping the contact window 180a of the flat layer 180. In this embodiment, the pixel array substrate 10 may further include the conductive pattern 200 disposed on the first protective layer 190 and electrically connected to the first terminal 171 of the thin film transistor T through the contact window 190a of the first protective layer 190.

The pixel array substrate 10 further includes a first insulating layer 210 disposed on the pixel driving circuit PC. For example, in this embodiment, the first insulating layer 210 may be disposed on the conductive pattern 200 and the first protective layer 190, but the disclosure is not limited thereto.

The pixel array substrate 10 further includes the adjustment structure M4 disposed on the first insulating layer 210. For example, in this embodiment, the pixel array substrate 10 may further include a second protective layer 220 disposed on the first insulating layer 210, and the adjustment structure M4 may be disposed on the second protective layer 220, but the disclosure is not limited thereto.

The pixel array substrate 10 further includes the pad group 270 electrically connected to the pixel driving circuit PC. The adjustment structure M4 is electrically connected to the pad group 270. The adjustment structure M4 is located between the pad group 270 and the pixel driving circuit PC. For example, in this embodiment, the pixel array substrate 10 further includes a third protective layer 260 disposed on the adjustment structure M4. The third protective layer 260 may have contact windows 260a and 260b. The pad group 270 is disposed on the third protective layer 260 and is electrically connected to the adjustment structure M4 through the contact window 260a. The pad group 270 may be directly in contact with the adjustment structure M4. The first insulating layer 210 may have a contact window 210a overlapping the conductive pattern 200. The second protective layer 220 may have a contact window 220a overlapping the contact window 210a of the first insulating layer 210. The adjustment structure M4 may be electrically connected to the conductive pattern 200 through the contact window 220a of the second protective layer 220. The pad group 270 may be electrically connected to the pixel driving circuit PC through the adjustment structure M4 and the conductive pattern 200, but the disclosure is not limited thereto.

The adjustment structure M4 includes a first adjustment part M4a and a second adjustment part M4r. At least a part of the first adjustment part M4a overlaps with the pad group 270. The second adjustment part M4r is disposed outside the first adjustment part M4a and is staggered from the pad group 270. The region where the first adjustment part M4a is located includes a region 10a that needs to be laser welded. The region where the second adjustment part M4r is located includes a region 10r that does not require laser welding. It is worth noting that an absorptance of the first adjustment part M4a to a laser is higher than an absorptance of the second adjustment part M4r to the laser.

The pad group 270 includes a first pad 271 and a second pad 272 that are separated in structurally. The first pad 271 and the second pad 272 are respectively used for electrically connecting a plurality of electrodes of a light-emitting diode (LED) element (not shown). Specifically, in this embodi- ment, a plurality of conductive bumps (not shown) are respectively provided on the plurality of electrodes of the LED element (not shown), and the first pad 271 and the second pad 272 of the pixel array substrate 10 are used for common metal bonding with the plurality of conductive bumps on the plurality of electrodes of the LED element respectively in a laser welding process. When the laser welding process is performed, the laser is simultaneously transmitted to the regions 10a and 10r where the first adjustment part M4a and the second adjustment part M4r of the adjustment structure M4 are located. Since the absorptance of the first adjustment part M4a, which overlaps the pad group 270, to the laser is higher than the absorptance of the second adjustment part M4r to the laser, the first adjustment part M4a of the adjustment structure M4 can absorb more thermal energy converted from the laser, and the more thermal energy can be transferred to the pad group 270 through the first adjustment part M4a, so that the pad group 270 and the LED element are properly connected.

At the same time, the second adjustment part M4r distributed in the region 10r that does not require laser welding can reflect more of the laser, so that the thermal energy generated by the laser is not easily accumulated in the region 10r that does not require laser welding. Therefore, during the laser welding process, the pixel array substrate 10 is less likely to have excessive thermal expansion due to the thermal energy generated by the laser. The pixel array substrate 10 with less thermal expansion can be more accurately aligned with the LED element, thereby improving the bonding yield of the pixel array substrate 10 and the LED element.

In this embodiment, the first adjustment part M4a of the adjustment structure M4 has a first absorption area M4a-1 (shown in FIG. 1). The first absorption area M4a-1 overlaps the pad group 270, the area of the first absorption area M4a-1 is larger than the area of the pad group 270, and a vertical projection of the pad group 270 on the substrate 110 is within a vertical projection of the first absorption area M4a-1 on the substrate 110.

In this embodiment, the first adjustment part M4a of the adjustment structure M4 further has a second absorption area M4a-2 (shown in FIG. 1). The second absorption area M4a-2 is located around the first absorption area M4a-1 and has a distance g from the first absorption area M4a-1, and the first absorption area M4a-1 is connected with the second absorption area M4a-2. The second absorption area M4a-2 includes an auxiliary absorption area located around the pad group 270. The second absorption area M4a-2 helps to convert the laser irradiated to the adjacent region of the pad group 270 into thermal energy, and transfer the thermal energy to the first absorption area M4a-1 where the pad group 270 is located through thermal conduction, so as to facilitate the bonding between the pad group 270 and the LED element.

Figure 3:
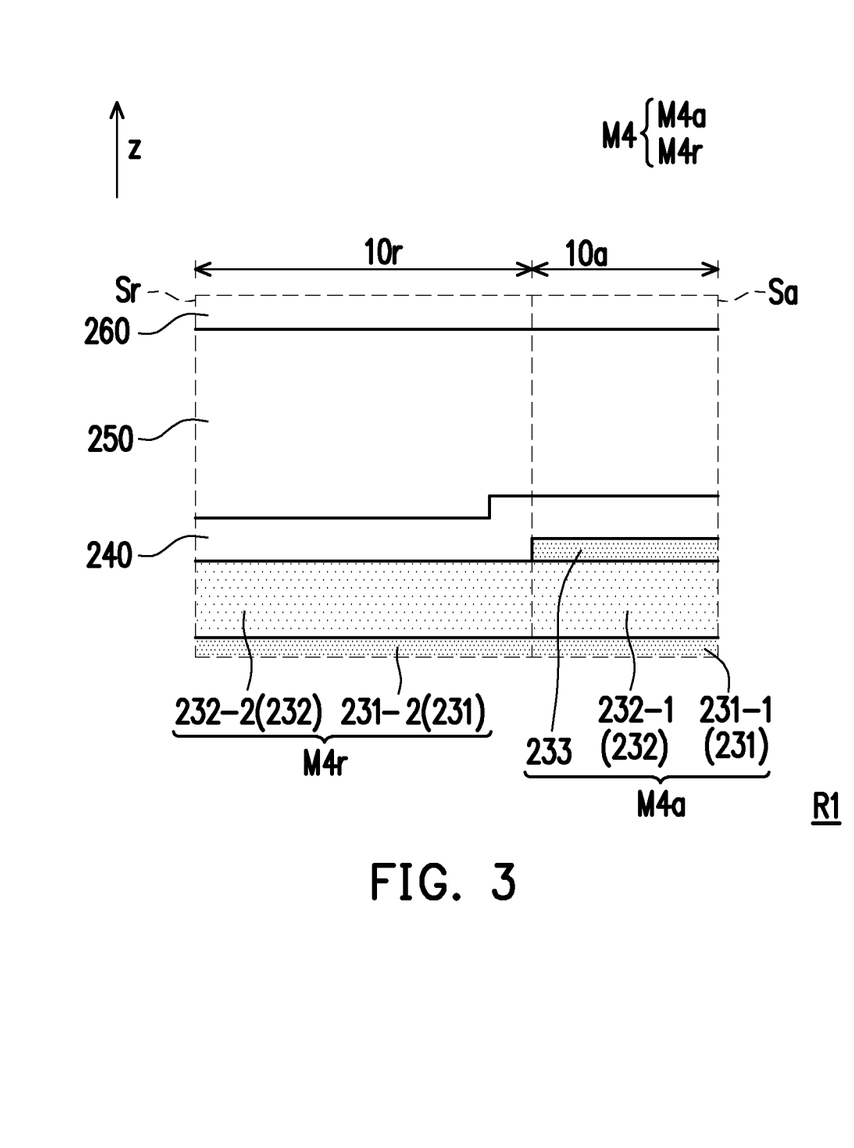
FIG. 3 is a schematic enlarged view of a partial cross-section of the pixel array substrate 10 according to an embodiment of the disclosure.
Figure 4:
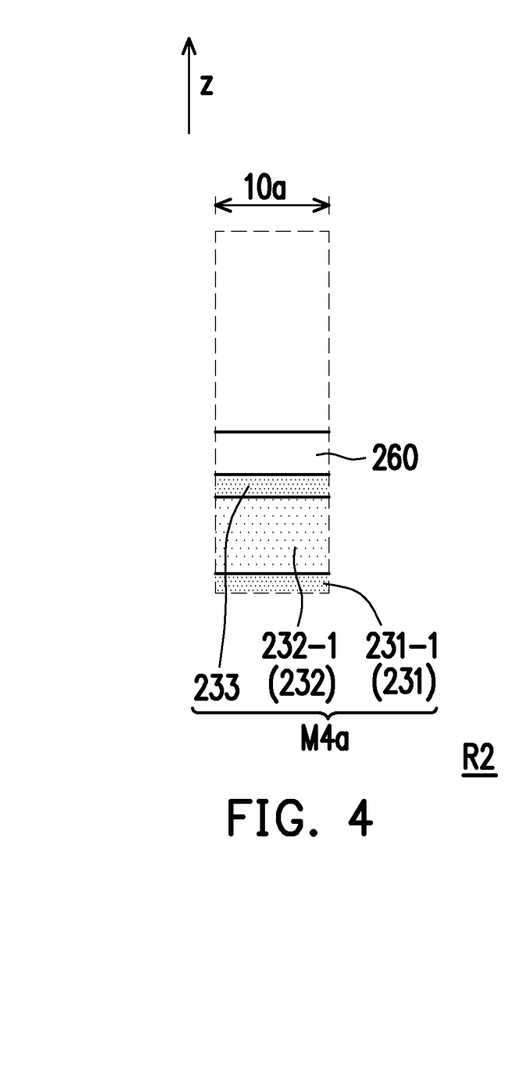
FIG. 4 is a schematic enlarged view of another partial cross-section of the pixel array substrate 10 according to an embodiment of the disclosure.

FIG. 3 is a schematic enlarged view of a partial cross-section of the pixel array substrate according to an embodiment of the disclosure. FIG. 3 corresponds to a part R1 of FIG. 2, and shows the detailed structures of the first adjustment part M4a and the second adjustment part M4r of the adjustment structure M4. FIG. 4 is a schematic enlarged view of another partial cross-section of the pixel array substrate 10 according to an embodiment of the disclosure. FIG. 4 corresponds to a part R2 of FIG. 2, and shows the detailed structure of the first adjustment part M4a of the adjustment structure M4.

Referring to FIG. 2, FIG. 3, and FIG. 4, in this embodiment, the pixel array substrate 10 further includes a second insulating layer 240. The adjustment structure M4 is located between the second insulating layer 240 and the first insulating layer 210. In this embodiment, the pixel array substrate 10 further includes a flat layer 250. The flat layer 250 is disposed on the second insulating layer 240, a part of the third protective layer 260 is disposed on the flat layer 250, and another part of the third protective layer 260 is disposed on a part of the adjustment structure M4.

The first adjustment part M4a has a first metal layer 233 in contact with the second insulating layer 240. The first adjustment part M4a and the second adjustment part M4r respectively have a first part 232-1 and a second part 232-2 of the second metal layer 232. The first metal layer 233 of the first adjustment part M4a is located between the second insulating layer 240 and the first part 232-1 of the second metal layer 232. The second part 232-2 of the second metal layer 232 of the second adjustment part M4r is in contact with the second insulating layer 240.

An absorptance of the first metal layer 233 to the laser is higher than an absorptance of the second metal layer 232 to the laser. That is to say, when the laser welding process is performed, the uppermost film layer of the first adjustment part M4a is the film layer that is first irradiated by the laser in the first adjustment part M4a. The uppermost film layer of the second adjustment part M4r is the film layer that is first irradiated by the laser in the second adjustment part M4r. The absorptance of the uppermost film layer (that is, the first metal layer 233) of the first adjustment part M4a to the laser is higher than the absorptance of the uppermost film layer (that is, the second metal layer 232) of the second adjustment part M4r to the laser.

Referring to FIG. 2, FIG. 3, and FIG. 4, in this embodiment, the first adjustment part M4a and the second adjustment part M4r further respectively have the first part 231-1 and the second part 231-2 of the third metal layer 231. The first part 231-1 of the third metal layer 231 of the first adjustment part M4a, the first part 232-1 of the second metal layer 232 of the first adjustment part M4a, and the first metal layer 233 of the first adjustment part M4a are stacked sequentially in a direction z away from the substrate 110, and the second part 231-2 of the third metal layer 231 of the second adjustment part M4r and the second part 232-2 of the second metal layer 232 of the second adjustment part M4r are stacked sequentially in the direction z away from the substrate 110.

Referring to FIG. 3, the first part 231-1 of the third metal layer 231 of the first adjustment part M4a, the first part 232-1 of the second metal layer 232 of the first adjustment part M4a, the first metal layer 233 of the first adjustment part M4a, a part of the flat layer 250, and a part of the third protective layer 260 are stacked to form a first stack structure Sa; and the second part 231-2 of the third metal layer 231 of the second adjustment part M4r, the second part 232-2 of the second metal layer 232 of the second adjustment part M4r, another part of the flat layer 250, and another part of the third protective layer 260 are stacked to form a second stack structure Sr.

Figure 5:
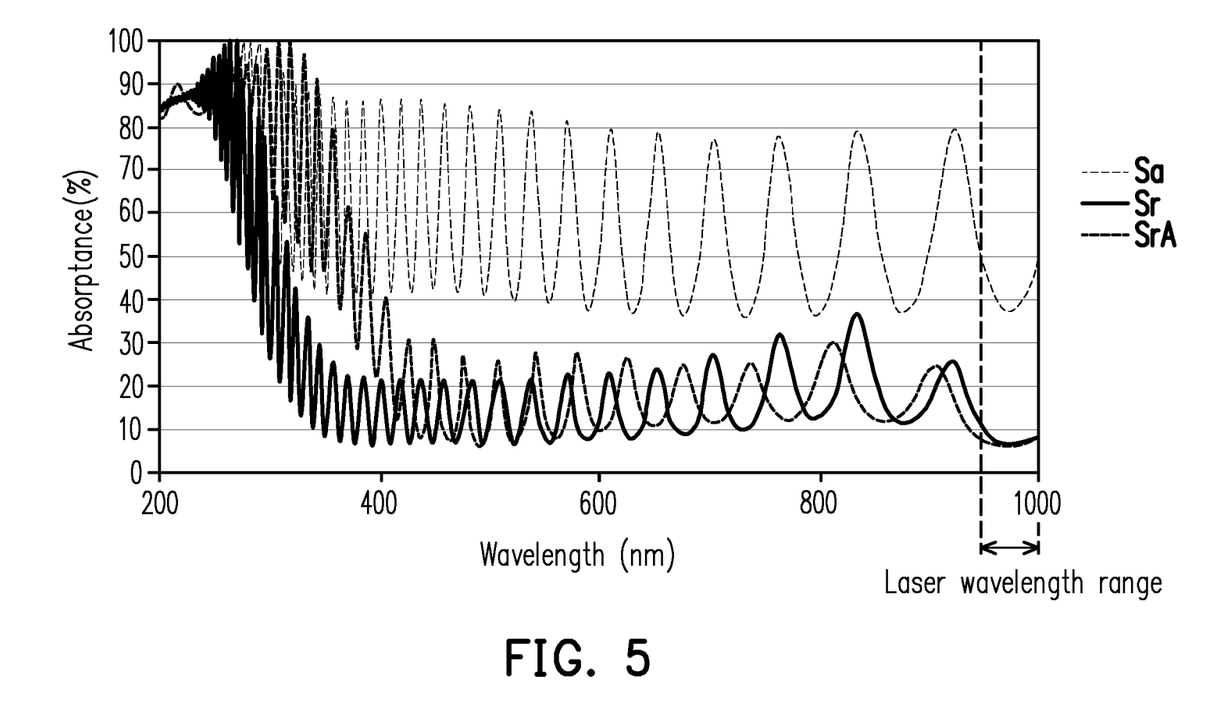
FIG. 5 shows the absorption spectra of the first stack structure Sa and the second stack structure Sr of an embodiment of the disclosure disposed on a glass.

FIG. 5 shows the absorption spectra of the first stack structure Sa and the second stack structure Sr of an embodiment of the disclosure disposed on a glass. It can be seen from the data in FIG. 5 that the absorptance of the first stack structure Sa, located in the region 10a that needs to be laser welded, to the laser is indeed higher than the absorptance of the second stack structure Sr, located in the region 10r that does not require laser welding, to the laser.

Figure 6:
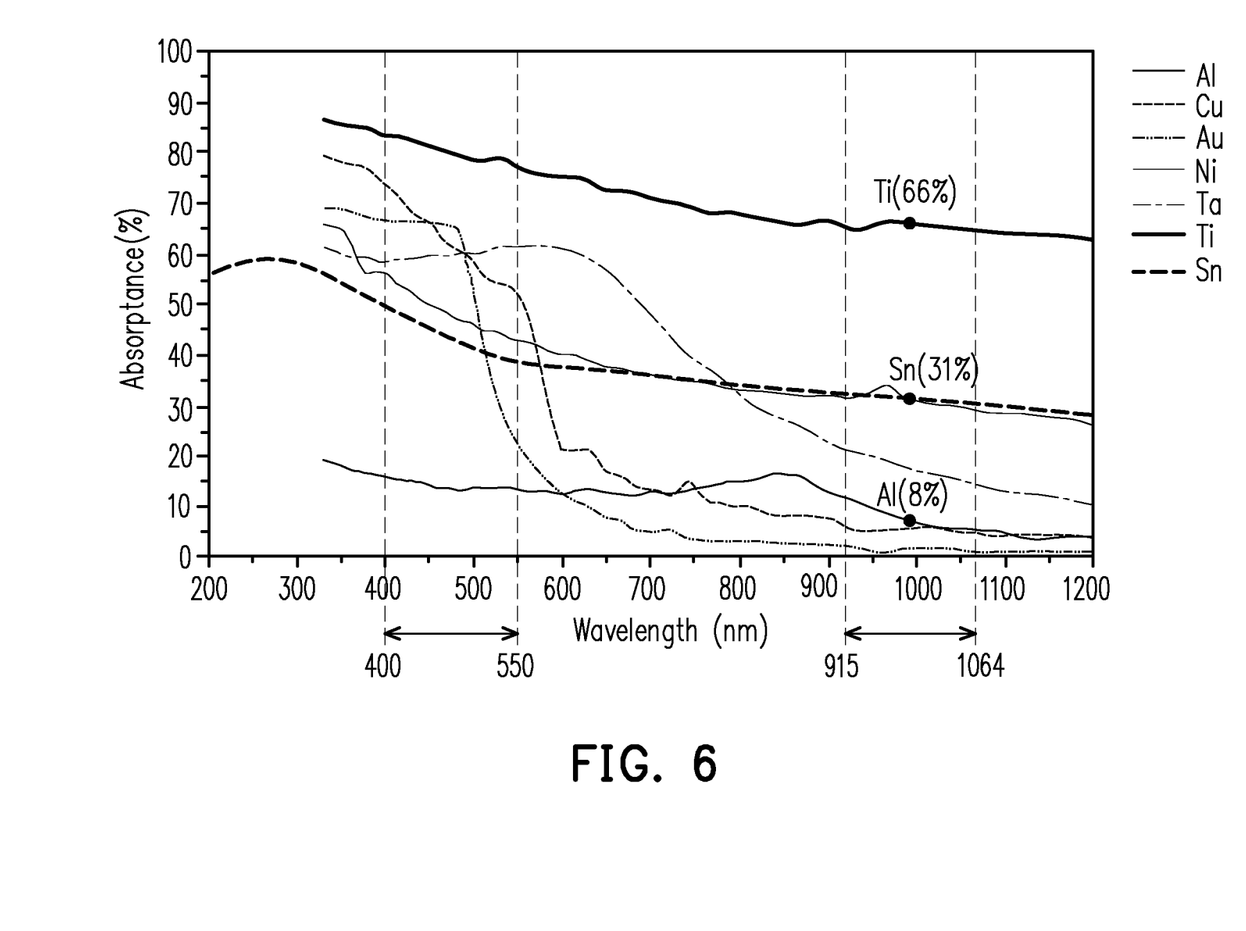
FIG. 6 shows the absorption spectra of various materials.

FIG. 6 shows the absorption spectra of various materials. Referring to FIG. 3, FIG. 4, and FIG. 6, for example, in this embodiment, the wavelength range of the laser used in the laser welding process may include 915 nm to 1064 nm, the material of the uppermost film layer (that is, the first metal layer 233) of the first adjustment part M4a may be titanium (Ti) that has a high absorptance to the laser, and the material of the uppermost film layer (that is, the second metal layer 232) of the second adjustment part M4r may be aluminum (Al) that has a low absorptance to the laser. However, the disclosure is not limited thereto. In other embodiments, the material of the uppermost film layer (that is, the first metal layer 233) of the first adjustment part M4a may also be selected from other materials that have a high absorptance to the laser, such as, but not limited to, tin (Sn) or nickel (Ni). The material of the uppermost film layer (that is, the second metal layer 232) of the second adjustment part M4r may also be selected from other materials that have a low absorptance to the laser, such as, but not limited to, silver (Ag) or copper (Cu).

In addition, in this embodiment, the material of the lowermost film layer (that is, the third metal layer 231) of the first adjustment part M4a and the second adjustment part M4r may selectively be titanium. However, the disclosure is not limited thereto. In other embodiments, the material of the lowermost film layer (that is, the third metal layer 231) of the first adjustment part M4a and the second adjustment part M4r may also be selected from other materials, such as, but not limited to, tin (Sn) or nickel (Ni).

It should be noted that the disclosure is not limited to the wavelength range of the laser used in the laser welding process. In other embodiments, the laser used in the laser welding process may include other wavelength ranges. For example, in another embodiment, the wavelength range of the laser used in the laser welding process may include 400 nm to 550 nm; in this case, the material of the uppermost film layer (that is, the first metal layer 233) of the first adjustment part M4a and the material of the uppermost film layer (that is, the second metal layer 232) of the second adjustment part M4r can be changed as appropriate. For example, according to the absorption spectra of various materials in FIG. 6, when the wavelength range of the laser includes 400 nm to 550 nm, the material of the uppermost film layer (that is, the first metal layer 233) of the first adjustment part M4a may be selected from titanium (Ti), copper (Cu), tin (Sn) or Nickel (Ni) that has a higher absorptance to the wavelength band of 400 nm to 550 nm, and the material of the uppermost film layer (that is, the second metal layer 232) of the second adjustment part M4r may be silver (Ag) that has a lower absorptance to the wavelength band of 400 nm to 550 nm.

It should be noted here that the following embodiment uses the reference numerals and some of the contents of the previous embodiments, in which the same reference numerals are used to represent the same or similar elements, and the description of the same technical contents will be omitted. Please refer to the previous embodiments for the description of the omitted part, which will not be repeated hereinafter.

Figure 7:
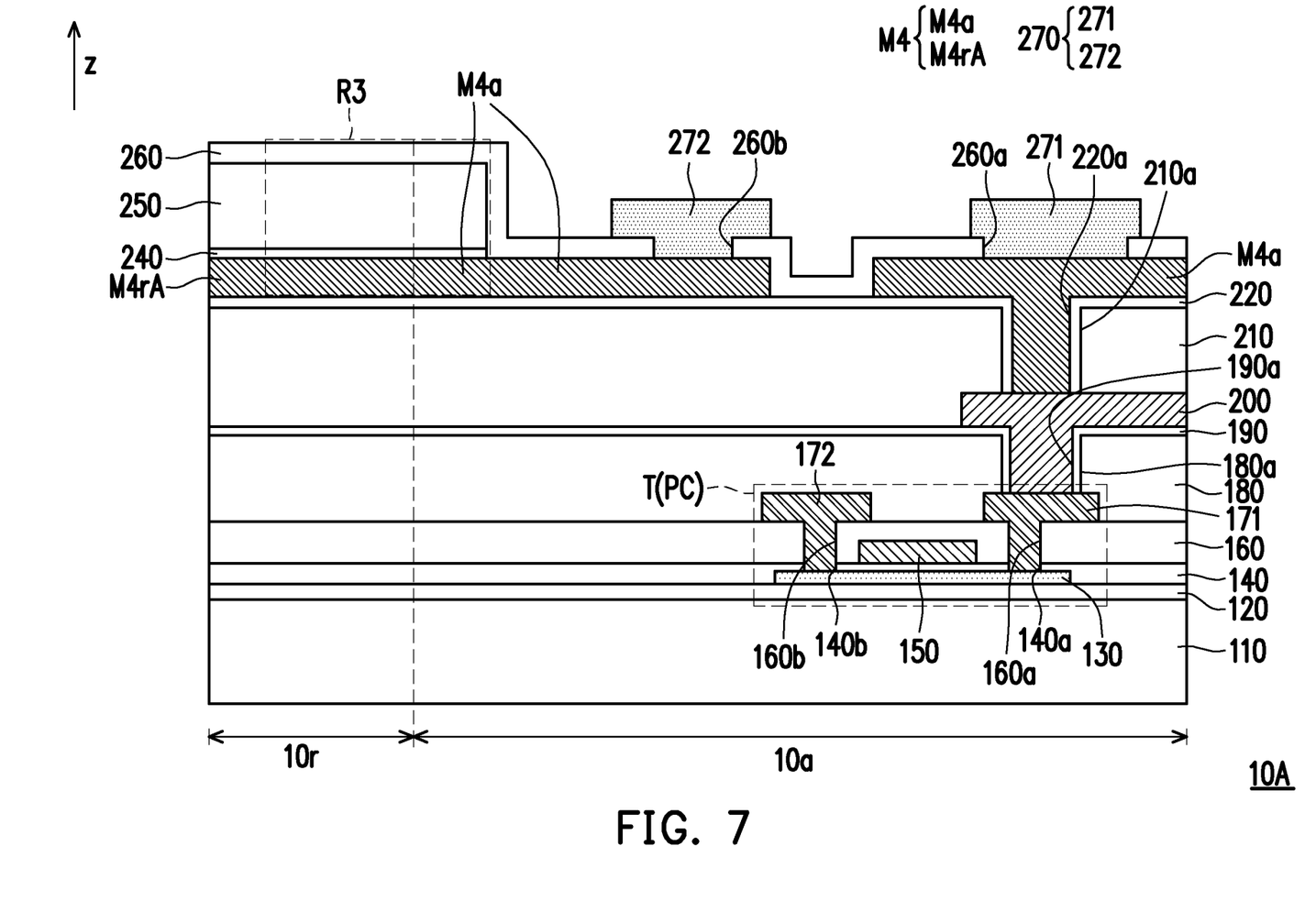
FIG. 7 is a schematic cross-sectional view of the pixel array substrate 10A according to another embodiment of the disclosure.
Figure 8:
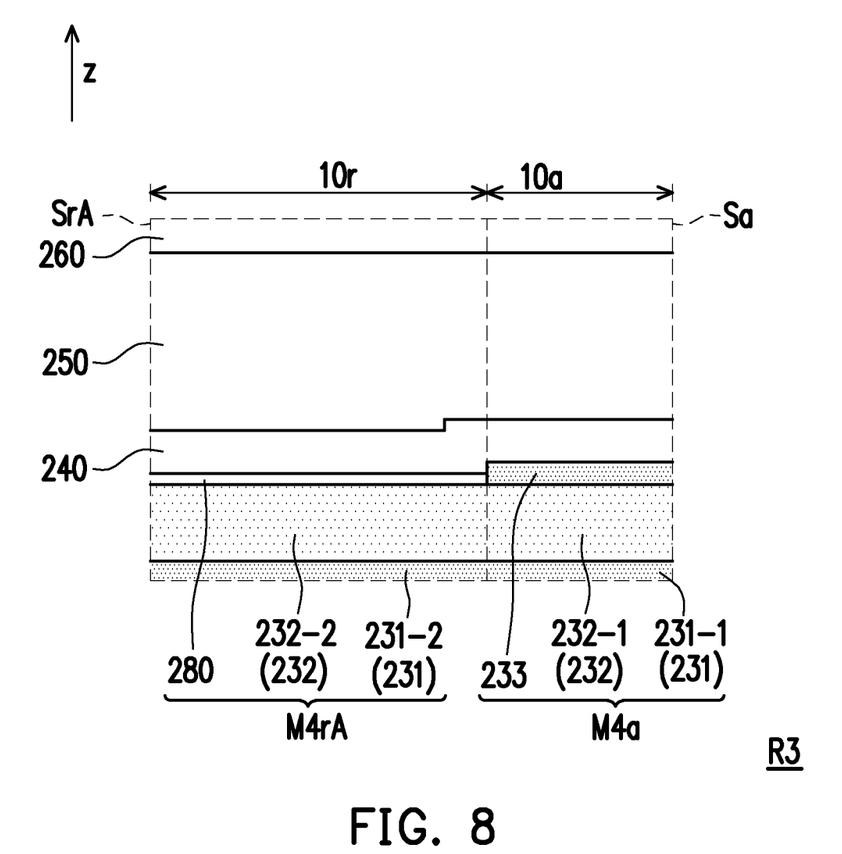
FIG. 8 is a schematic enlarged view of a partial cross-section of the pixel array substrate 10A according to another embodiment of the disclosure.

FIG. 7 is a schematic cross-sectional view of a pixel array substrate 10A according to another embodiment of the disclosure. FIG. 8 is a schematic enlarged view of a partial cross-section of the pixel array substrate 10A according to another embodiment of the disclosure. FIG. 8 corresponds to a part R3 of FIG. 7, and shows the detailed structures of the first adjustment part M4a and the second adjustment part M4rA of the adjustment structure M4.

The pixel array substrate 10A of this embodiment is similar to the aforementioned pixel array substrate 10, and the difference between the two pixel array substrates is that the second adjustment part M4rA of the pixel array substrate 10A of this embodiment is different from the second adjustment part M4r of the pixel array substrate 10 described above. Referring to FIG. 7 and FIG. 8, specifically, in this embodiment, the second adjustment part M4rA further includes a metal oxide layer 280 (shown in FIG. 8) that is in contact with the second insulating layer 240. The absorptance of the first metal layer 233 of the first adjustment part M4a to the laser is higher than the absorptance of the metal oxide layer 280 of the second adjustment part M4rA to the laser. For example, in this embodiment, the material of the metal oxide layer 280 may be indium-zinc oxide (IZO), but the disclosure is not limited thereto.

The second part 231-2 of the third metal layer 231 of the second adjustment part M4rA, the second part 232-2 of the second metal layer 232 of the second adjustment part M4rA, and the metal oxide layer 280 of the second adjustment part M4rA are stacked sequentially in the direction z away from the substrate 110. The second part 231-2 of the third metal layer 231 of the second adjustment part M4rA, the second part 232-2 of the second metal layer 232 of the second adjustment part M4rA, the metal oxide layer 280 of the second adjustment part M4rA, a part of the flat layer 250, and a part of the third protective layer 260 are stacked to form a second stack structure SrA.

FIG. 5 further shows the absorption spectrum of the second stack structure SrA of another embodiment of the disclosure disposed on a glass. It can be seen from the data in FIG. 5 that regarding the wavelength range of the laser used in the laser welding process, the absorptance of the first stack structure Sa, located in the region 10a that needs to be laser welded, to the laser is indeed higher than the absorptance of the second stack structure SrA, located in the region 10r that does not require laser welding, to the laser. In addition, compared with the second stack structure Sr of FIG. 3, the metal oxide layer 280 disposed in the second stack structure SrA of FIG. 8 can further reduce the absorptance, which helps to further improve the bonding yield of the pixel array substrate 10A and the LED element.

What is claimed is:
1. A pixel array substrate, comprising:
a substrate;
a pixel driving circuit disposed on the substrate;
a first insulating layer disposed on the pixel driving circuit;
a pad group electrically connected to the pixel driving circuit; and
an adjustment structure disposed on the first insulating layer and electrically connected to the pad group, wherein the adjustment structure is located between the pad group and the pixel driving circuit, and the adjustment structure comprises:
a first adjustment part, wherein at least a part of the first adjustment part overlaps the pad group; and
a second adjustment part disposed outside the first adjustment part and staggered from the pad group, wherein an absorptance of the first adjustment part to a laser is higher than an absorptance of the second adjustment part to the laser.
2. The pixel array substrate according to claim 1, wherein the first adjustment part comprises a first absorption area,
the first absorption area overlaps the pad group,
an area of the first absorption area is larger than an area of the pad group, and
a vertical projection of the pad group on the substrate is located within a vertical projection of the first absorption area on the substrate.
3. The pixel array substrate according to claim 2, wherein the first adjustment part further comprises a second absorption area,
the second absorption area is located around the first absorption area and has a distance from the first absorption area, and
the first absorption area is connected with the second absorption area.
4. The pixel array substrate according to claim 1, further comprising:
a second insulating layer, wherein the adjustment structure is located between the second insulating layer and the first insulating layer;
the first adjustment part comprises a first metal layer in contact with the second insulating layer;
the first adjustment part and the second adjustment part respectively comprise a first part and a second part of a second metal layer;
the first metal layer of the first adjustment part is located between the second insulating layer and the first part of the second metal layer;
the second part of the second metal layer of the second adjustment part is in contact with the second insulating layer; and
an absorptance of the first metal layer to the laser is higher than an absorptance of the second metal layer to the laser.
5. The pixel array substrate according to claim 4, wherein the first adjustment part and the second adjustment part further respectively comprise a first part and a second part of a third metal layer,
the first part of the third metal layer of the first adjustment part, the first part of the second metal layer of the first adjustment part, and the first metal layer of the first adjustment part are stacked sequentially in a direction away from the substrate, and
the second part of the third metal layer of the second adjustment part and the second part of the second metal layer of the second adjustment part are stacked sequentially in the direction away from the substrate.
6. The pixel array substrate according to claim 4, wherein a wavelength range of the laser includes 915 nm to 1064 nm;
a material of the first metal layer is selected from titanium, tin or nickel; and
a material of the second metal layer is selected from aluminum, silver or copper.
7. The pixel array substrate according to claim 4, wherein a wavelength range of the laser includes 400 nm to 550 nm;
a material of the first metal layer is selected from titanium, copper, tin or nickel; and
a material of the second metal layer is selected from silver.
8. The pixel array substrate according to claim 1, further comprising:
a second insulating layer, wherein the adjustment structure is located between the second insulating layer and the first insulating layer;
the first adjustment part comprises a first metal layer in contact with the second insulating layer;
the second adjustment part comprises a metal oxide layer in contact with the second insulating layer; and
an absorptance of the first metal layer to the laser is higher than an absorptance of the metal oxide layer to the laser.

9. The pixel array substrate according to claim 8, wherein the first adjustment part and the second adjustment part further respectively comprise a first part and a second part of a second metal layer, the first metal layer of the first adjustment part is located between the second insulating layer and the first part of the second metal layer of the first adjustment part, and the metal oxide layer of the second adjustment part is located between the second insulating layer and the second part of the second metal layer of the second adjustment part.

10. The pixel array substrate according to claim 9, wherein the first adjustment part and the second adjustment part further respectively comprise a first part and a second part of a third metal layer, the first part of the third metal layer of the first adjustment part, the first part of the second metal layer of the first adjustment part, and the first metal layer of the first adjustment part are stacked sequentially in a direction away from the substrate, and the second part of the third metal layer of the second adjustment part, the second part of the second metal layer of the second adjustment part, and the metal oxide layer of the second adjustment part are stacked sequentially in the direction away from the substrate.

11. The pixel array substrate according to claim 9, wherein a wavelength range of the laser includes 915 nm to 1064 nm;

a material of the first metal layer is selected from titanium, tin or nickel; and a material of the second metal layer is selected from aluminum, silver or copper.

12. The pixel array substrate according to claim 9, wherein a wavelength range of the laser includes 400 nm to 550 nm;

a material of the first metal layer is selected from titanium, copper, tin or nickel; and a material of the second metal layer is selected from silver.

* * * * *